US011199590B2

(12) United States Patent
Shirane et al.

(10) Patent No.: US 11,199,590 B2
(45) Date of Patent: Dec. 14, 2021

(54) SAFETY ESTIMATION DEVICE FOR BATTERIES AND SAFETY ESTIMATION METHOD FOR BATTERIES

(71) Applicant: Panasonic Intellectual Property Management Co., Ltd., Osaka (JP)

(72) Inventors: Takayuki Shirane, Osaka (JP); Mikiya Fujii, Osaka (JP); Koji Morikawa, Tokyo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/847,670

(22) Filed: Apr. 14, 2020

(65) Prior Publication Data

US 2020/0341065 A1 Oct. 29, 2020

(30) Foreign Application Priority Data

Apr. 26, 2019 (JP) .............................. JP2019-086810
Oct. 24, 2019 (JP) .............................. JP2019-193093

(51) Int. Cl.
*G01R 31/367* (2019.01)
*H01M 10/42* (2006.01)
*G01R 31/374* (2019.01)
*G01R 31/3835* (2019.01)

(52) U.S. Cl.
CPC ......... *G01R 31/367* (2019.01); *G01R 31/374* (2019.01); *G01R 31/3835* (2019.01); *H01M 10/4235* (2013.01)

(58) Field of Classification Search
CPC .................................................... G01R 31/367
USPC ........................................................... 702/63
See application file for complete search history.

(56) References Cited

U.S. PATENT DOCUMENTS

| 2003/0184307 | A1* | 10/2003 | Kozlowski | ............ | H01M 10/48 |
| | | | | | 324/427 |
| 2017/0115355 | A1* | 4/2017 | Willard | ................ | G01R 31/392 |
| 2018/0143257 | A1* | 5/2018 | Garcia | ................. | G01R 31/382 |
| 2018/0196107 | A1* | 7/2018 | Fleischer | ............... | G01R 31/52 |
| 2020/0011932 | A1* | 1/2020 | Hooshmand | ......... | G01R 31/367 |
| 2020/0164763 | A1* | 5/2020 | Holme | .................... | B60L 58/10 |

FOREIGN PATENT DOCUMENTS

| JP | 2013-121303 | 6/2013 |
| JP | 2013-217897 | 10/2013 |
| JP | 2017-162790 | 9/2017 |
| WO | 2013/084663 | 6/2013 |
| WO | 2014/155726 | 10/2014 |

* cited by examiner

*Primary Examiner* — Ricky Go

(74) *Attorney, Agent, or Firm* — McDermott Will and Emery LLP

(57) ABSTRACT

A safety estimation device for batteries includes a parameter acquirer that acquires a design parameter of a battery, a calculator that calculates voltage behavior of the battery from the design parameter, based on a machine-learned logical model, and an outputter that outputs the voltage behavior as information about safety regarding heat generation of the battery.

19 Claims, 7 Drawing Sheets

SAFETY ESTIMATION DEVICE FOR BATTERIES AND SAFETY ESTIMATION METHOD FOR BATTERIES

BACKGROUND

1. Technical Field

The present disclosure relates to a safety estimation device for batteries and a safety estimation method for batteries.

2. Description of the Related Art

There is a demand in recent years for realizing high energy density in secondary batteries, which are used in electronic equipment such as cellular phones, laptop computers, and the like, used for in-vehicle power sources, and used for other devices and apparatuses. From this perspective, non-aqueous electrolyte secondary batteries in which high energy density can be realized are in widespread use. Non-aqueous electrolyte secondary batteries include, for example, a positive electrode, a negative electrode, a separator interposed therebetween, and a non-aqueous electrolyte. There is known a battery with a structure including an electrode group where a positive electrode and negative electrode are rolled up with a separator interposed therebetween, to increase space efficiency and realize high energy density.

Deterioration of battery capacity when a battery is repeatedly charged and discharged is called "life characteristic", which is one of several important battery characteristics. In addition to taking a long time to evaluate the life characteristic, there is a need to isolate and evaluate factors contributing to deterioration under various conditions. Accordingly, it takes a significant amount of time to improve this characteristic. In recent years, there has been disclosed a life characteristic estimation technique and a control technique for extending life (e.g., Japanese Patent No. 5561268, International Publication No. 2014/155726, and Japanese Unexamined Patent Application Publication No. 2013-217897).

On the other hand, energy density and safety have come to be in a tradeoff relation as energy density of non-aqueous electrolyte secondary batteries increases. Accordingly, safety of batteries is becoming a large issue.

Generally, the safety of non-aqueous electrolyte secondary batteries is affected by thermal stability of materials, degree of allowance in design, appropriateness of the manufacturing process, and so forth. Effects on safety depend greatly on thermal stability of positive-electrode active materials, and particularly on thermal stability with regard to release of oxygen from positive-electrode active materials in a charged state. Much study is being done regarding synthetic processes and material compositions to raise thermal stability of positive-electrode active materials. In recent years, a technique has been disclosed that derives material design of active materials with higher thermal stability by a technique that uses first-principles calculation (e.g., Japanese Unexamined Patent Application Publication No. 2017-162790).

SUMMARY

However, although a material design technique that raises safety of batteries has been reported, as in Japanese Unexamined Patent Application Publication No. 2017-162790, there has been no report relating to a safety estimation technique regarding heat generation of batteries.

One non-limiting and exemplary embodiment provides a safety estimation device for batteries, and so forth, in which safety regarding heat generation of batteries can be estimated from design parameters of the batteries, even with regard to batteries of unknown design.

In one general aspect, the techniques disclosed here feature a safety estimation device for batteries, including: a parameter acquirer that acquires a design parameter of a battery; a calculator that calculates voltage behavior of the battery from the design parameter, based on a machine-learned logical model; and an outputter that outputs the voltage behavior as information about safety regarding heat generation of the battery.

According to the present disclosure, a safety estimation device for batteries and so forth can be realized in which safety regarding heat generation of batteries can be estimated from design parameters of the batteries.

It should be noted that general or specific embodiments may be implemented as a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Underlying Knowledge Forming Basis of the Present Disclosure

An estimation technique regarding batteries in the related art is an estimation technique that uses voltage, current, temperature, and so forth which are measurable, or that uses map data measured beforehand under various conditions, to estimate life characteristics of batteries. It is difficult to use an estimation technique in the related art, of which the object is estimating life characteristics, for estimating safety of batteries. Accordingly, it is desirable to realize a technique where safety regarding heat generation of batteries can be estimated for batteries with unknown combination designs.

Figure 1:
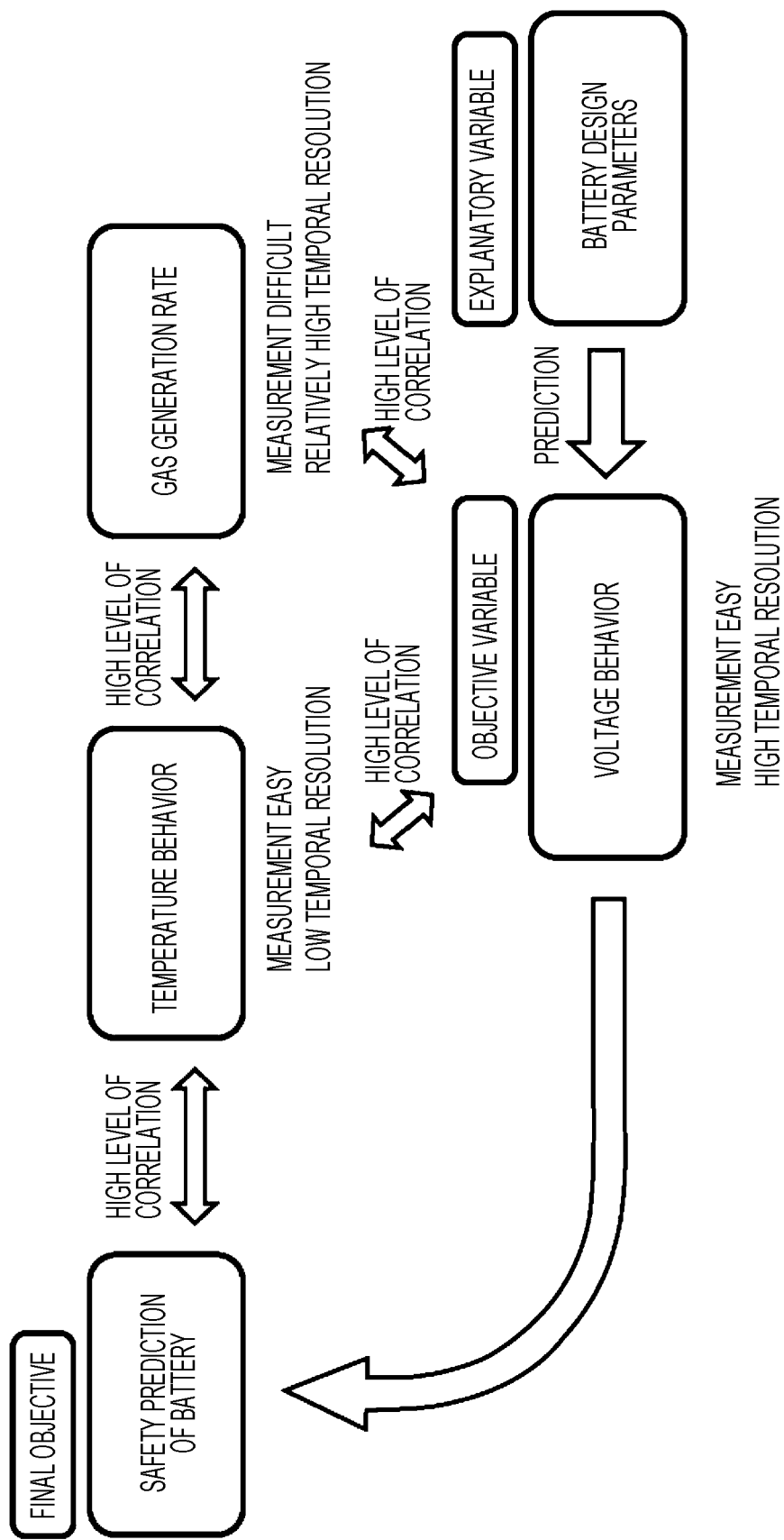
FIG. 1 is a diagram describing issues in safety estimation regarding heat generation of batteries.

FIG. 1 is a diagram describing issues in estimating safety regarding heat generation of batteries. Safety regarding heat generation of batteries and temperature behavior of batteries have a high level of correlation, as illustrated in FIG. 1. Accordingly, in order to estimate safety regarding heat generation of batteries, estimating temperature behavior is directly and commonly performed.

The present inventors have come upon the following knowledge for estimating safety regarding heat generation of batteries. Temperature behavior can be easily measured by using a thermocouple or the like. On the other hand, temporal resolution regarding change is not sufficient in behavior of temperature, and factors contributing to error due to environment, measurement conditions, and so forth are great. Accordingly, factors contributing to error in temperature behavior are great in a logical model where machine learning is performed by using a battery design parameter as an explanatory variable and battery temperature behavior as an objective variable, and accordingly temperature behavior cannot be estimated with high precision.

On the other hand, gas generation rates of batteries have a high level of correlation with temperature behavior of batteries. Voltage behavior of batteries also has a high level of correlation with temperature behavior of batteries and gas generation rates of batteries. Accordingly, temperature behavior of batteries can be estimated by estimating the voltage behavior of the batteries, which further leads to estimating stability regarding heat generation of the batteries. Moreover, voltage behavior of batteries has a high level of temporal resolution regarding change, and can be easily measured.

According to the present disclosure, a safety estimation device for batteries and so forth are provided in which safety regarding heat generation of batteries can be estimated from design parameters of the batteries.

The following is an overview of an aspect of the present disclosure.

A safety estimation device for batteries according to an aspect of the present disclosure includes a parameter acquirer that acquires a design parameter of a battery, a calculator that calculates voltage behavior of the battery from the design parameter, based on a machine-learned logical model, and an outputter that outputs the voltage behavior as information about safety regarding heat generation of the battery.

Accordingly, voltage behavior is estimated from a design parameter of the battery, and voltage behavior is output as information about safety of the battery. Thus, the safety estimation device for batteries according to this aspect can estimate safety regarding heat generation of the battery from the design parameter of the battery, even for a battery with unknown combination design.

Also, for example, the safety estimation device may further include a training data acquirer that acquires a training design parameter of a training battery and training voltage behavior data indicating voltage behavior of the training battery, and a learner that constructs the machine-learned logical model by causing a logical model to undergo machine learning, using the training design parameter as an explanatory variable and the training voltage behavior data as an objective variable.

Accordingly, a machine-learned logical model is constructed by machine learning with voltage behavior, which is easily measured and has high temporal resolution in change, as the objective variable. Voltage behavior also has a high level of correlation with temperature of the battery. Thus, the safety estimation device for batteries according to this aspect can construct a machine-learned logical model that has a high level of estimation precision from a design parameter of the battery, in a case of estimating safety regarding heat generation of the battery.

Also, for example, the learner may use gradient boosting as a method to construct the machine-learned logical model in the machine learning.

A machine-learned logical model constructed by using gradient boosting can estimate voltage behavior of the battery from design parameters of the battery with a higher level of estimation precision.

Also, for example, the calculator may further calculate temperature of the battery from the voltage behavior of the battery that the calculator calculates, based on a correlation between voltage behavior of a training battery and temperature of the training battery, and the outputter may further output the temperature.

Accordingly, the temperature of the battery is output via the voltage behavior of the battery that is calculated from the design parameter of the battery. Thus, safety regarding heat generation of the battery can be estimated more directly.

Also, for example, the design parameter may include at least one of (i) dimensions of an electrode, (ii) density of the electrode, (iii) dimensions of a separator, (iv) amount of electrolytic solution, (v) composition of material of the electrode or the electrolytic solution, (vi) physical property of material of the electrode or the electrolytic solution, and (vii) capacity of the battery, making up part of the battery.

Accordingly, a parameter that has great contribution to estimation of voltage behavior of the battery is included in the design parameter of the battery. Thus, voltage behavior of the battery can be estimated with a higher level of estimation precision from the design parameter of the battery.

Also, a safety estimation method for batteries according to an aspect of the present disclosure includes acquiring a design parameter of a battery, calculating voltage behavior of the battery from the design parameter, based on a machine-learned logical model, and outputting the voltage behavior as information about safety regarding heat generation of the battery.

Accordingly, voltage behavior of the battery is estimated from a design parameter of the battery, and voltage behavior is output as information about safety of the battery. Thus, the safety estimation method for batteries according to this aspect can estimate safety regarding heat generation of the battery from the design parameter of the battery, even for a battery with unknown combination design.

Also, for example, the safety estimation method may further include acquiring a training design parameter of a training battery, and training voltage behavior data indicating voltage behavior of the training battery, and constructing the machine-learned logical model by causing a logical model to undergo machine learning, using the training design parameter as an explanatory variable and the training voltage behavior data as an objective variable.

Accordingly, a machine-learned logical model is constructed by machine learning by using voltage behavior of the battery, which is easily measured and has high temporal resolution in change, as the objective variable. Voltage behavior of the battery also has a high level of correlation with temperature of the battery. Thus, the safety estimation method for batteries according to this aspect can construct a machine-learned logical model that has a high level of estimation precision from a design parameter of the battery, in a case of estimating safety regarding heat generation of the battery.

An embodiment of the present disclosure will be described below with reference to the drawings.

Note that the embodiments described below are all comprehensive or specific examples. Values, shapes, materials, components, arrangement and connected states of components, steps, the order of steps, and so forth, indicated in the following embodiments, are only exemplary, and are not intended to restrict the present disclosure. Components in the following embodiments which are not included in an independent Claim are described as being optional components.

Embodiment

Configuration of Safety Estimation Device for Batteries

Figure 2:
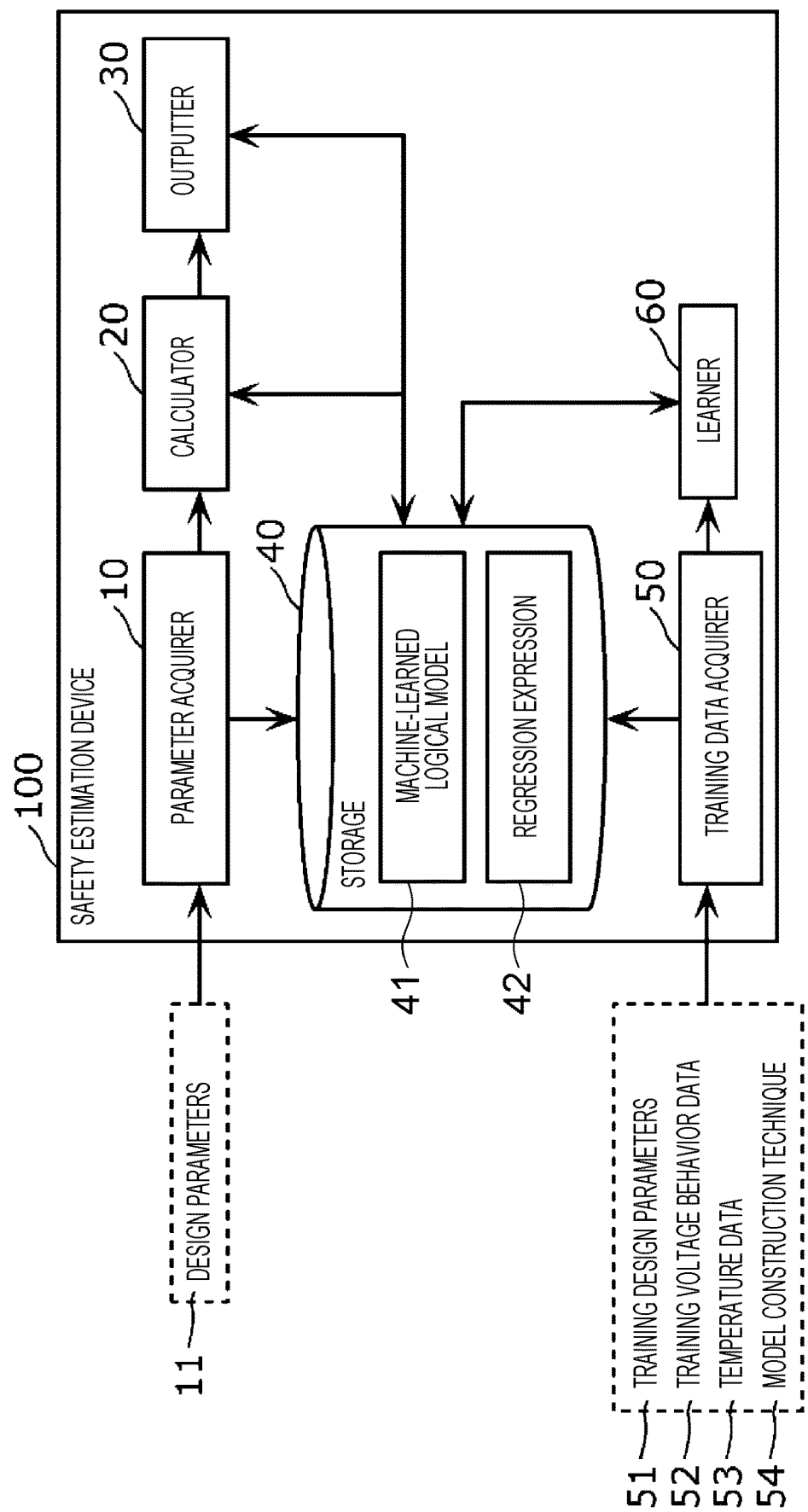
FIG. 2 is a functional block diagram illustrating an example of a configuration of a safety estimation device for batteries according to an embodiment.

FIG. 2 is a functional block diagram illustrating an example of the configuration of a safety estimation device 100, for batteries, according to the present embodiment.

The safety estimation device 100 according to the present embodiment has a parameter acquirer 10, a calculator 20, an outputter 30, a storage 40, a training data acquirer 50, and a learner 60, as illustrated in FIG. 2.

The safety estimation device 100 is a safety estimation device that performs estimation regarding safety of batteries. Specifically, the safety estimation device 100 estimates safety regarding heat generation at the time of batteries short-circuiting.

The parameter acquirer 10 acquires design parameters 11 of batteries. The parameter acquirer 10 is an input interface such as a keyboard or the like, for example, and acquires design parameters 11 of batteries by receiving input of design parameters 11 of batteries. The parameter acquirer 10 may also be an external communication interface, and may acquire design parameters 11 of batteries by reading data tables of design parameters 11 of batteries.

The design parameters 11 of batteries are materials, characteristics, shapes, dimensions, etc., of the elements making up the battery. Examples of design parameters 11 of batteries include the following that make up part of the battery from a perspective of improving precision of estimating safety of the battery, namely, (i) dimensions of electrodes, (ii) density of electrodes, (iii) dimensions of separator, (iv) amount of electrolytic solution, (v) composition of material of electrodes or electrolytic solution, (vi) physical properties of material of electrodes or electrolytic solution, and (vii) capacity of the battery.

The calculator 20 receives the design parameters 11 of the battery from the parameter acquirer 10. The calculator 20 calculates voltage behavior based on a machine-learned logical model 41 such as a model expression or the like, from the design parameters 11 of the battery. Voltage behavior is a value calculated by using the average, deviation, differential, or integral or the like, of voltage, for example.

The calculator 20 may further calculate temperature of the battery from the calculated voltage behavior of the battery, based on a regression expression 42 that shows a correlation between voltage behavior of the battery and temperature of the battery. The temperature of the battery is the temperature of the battery after a predetermined amount of time has elapsed following short-circuiting occurring, and is the temperature at a point 10 seconds after occurrence of the short-circuiting, for example.

Also, the calculator 20 may calculate change in pressure in the battery, based on the machine-learned logical model 41, from the design parameters 11 of the battery. Change in pressure in the battery corresponds to, for example, a gas generation rate or the like in a case where pressure is converted into gas volume by a state equation.

The calculator 20 may store information such as the received design parameters 11 and calculated voltage behavior of the battery in the storage 40. For example, information regarding the battery including the design parameters 11, and the calculated voltage behavior of the battery, are saved as a correlated table in the storage 40.

The calculator 20 comprises, for example, a central processing unit (CPU), random access memory (RAM), read only memory (ROM), and so forth.

The outputter 30 receives calculation results of voltage behavior of the battery from the calculator 20. The outputter 30 outputs the voltage behavior of the battery as information about safety regarding heat generation of the battery. The outputter 30 is made up of a CPU, RAM, ROM, and display and so forth, for example, and displays information about safety regarding heat generation of the battery as output thereof. The outputter 30 may also have a configuration including a communication interface for transmitting information about safety regarding heat generation of the battery to an external storage device or external terminal as output.

The outputter 30 may further output calculation results of the temperature of the battery. The outputter 30 may also output calculation results of the temperature of the battery as information about safety regarding heat generation of the battery.

The outputter 30 may also perform output regarding the machine-learned logical model 41 and regression expression 42 stored in the storage 40. In a case where the design parameters 11 and information such as the calculated voltage behavior of the battery are stored in the storage 40, the outputter 30 may output the design parameters 11 and information such as the calculated voltage behavior of the battery that are stored.

The storage 40 stores the machine-learned logical model 41 and regression expression 42 that the calculator 20 uses. The storage 40 may also store voltage behavior of the battery and temperature of the battery that the calculator 20 has calculated.

The machine-learned logical model 41 is a logical model that has been machine-learned, and that has been constructed by causing a logical model constructed by a model construction technique such as gradient boosting, support-vector regression, random forest regression, or the like, to undergo machine learning. The machine-learned logical model 41 is a logical model that has been machine-learned, where machine learning has been performed by using gradient boosting, for example, from the perspective of improving estimation precision of safety of the battery. The storage 40 may store a single machine-learned logical model 41, or may store multiple machine-learned logical models 41 where machine learning has been performed by using different model construction techniques.

The regression expression 42 is a regression expression that shows a correlation between voltage behavior of the battery and temperature of the battery.

The storage 40 may store a logical model for machine learning by the learner 60 described later, and a logical model in which machine learning has been performed partway.

The storage 40 may also store a safety determination standard corresponding to the voltage behavior of the battery. The safety determination standard is a standard regarding which determination is made that safety is high if the voltage behavior is at a threshold value or lower, for example.

The storage 40 comprises rewritable nonvolatile memory, such as a hard disk drive, solid state drive, or the like.

The training data acquirer 50 acquires training design parameters 51 of the battery and training voltage behavior data 52. The training data acquirer 50 may also acquire temperature data 53 that indicates the temperature of the battery. The training data acquirer 50 comprises an input interface such as a keyboard or the like, or a communication interface or the like, for example. The training data acquirer 50 may be provided with a voltage sensor such as a voltmeter, and a temperature sensor such as a temperature sensing element, a thermocouple, or the like, and acquire the training voltage behavior data 52 and temperature data 53 measured by the voltage sensor and temperature sensor, respectively. The training data acquirer 50 stores the acquired training design parameters 51, training voltage behavior data 52, and temperature data 53 in the storage 40. The training data acquirer 50 also acquires a model construction technique 54 that is used for machine learning, and transmits the model construction technique 54 to the learner 60.

The training design parameters 51 of the battery are the same parameters as the above-described design parameters 11. The training design parameters 51 are data measured from an actual battery (e.g., a battery for evaluation).

The training voltage behavior data 52 is measured data indicating voltage behavior of the battery corresponding to the training design parameters 51 of the battery. The training voltage behavior data 52 is measured data such as voltage behavior after short-circuiting occurs, for example.

The temperature data 53 is measured data indicating temperature of the battery corresponding to the training design parameters 51 of the battery. The temperature data 53 is temperature data of the battery after a predetermined amount of time, such as 10 seconds, has elapsed after short-circuiting occurs for example.

A model construction technique commonly used for machine learning is used for the model construction technique 54. Examples of the model construction technique 54 include gradient boosting, support-vector regression, random forest regression, and so forth. The model construction technique 54 may be any one of these model construction techniques, or may be a model construction technique where multiple models are combined. Of these, gradient boosting may be used from the perspective of improving estimation precision of safety of the battery.

The learner 60 constructs the machine-learned logical model 41 by causing the logical model constructed by using the acquired model construction technique 54 to undergo machine learning, with the training design parameters 51 as explanatory variables and the training voltage behavior data 52 as an objective variable. The learner 60 stores the constructed machine-learned logical model 41 in the storage 40.

The learner 60 may also derive the regression expression 42 from the training voltage behavior data 52 and temperature data 53. The learner 60 stores the derived regression expression 42 in the storage 40.

The learner 60 comprises a CPU, RAM, ROM, and so forth, for example.

The machine-learned logical model 41 and regression expression 42 may be constructed by the learner 60. Alternatively, a machine-learned logical model 41 and regression expression 42 constructed beforehand may be stored in the storage 40.

Operations of Safety Estimation Device for Batteries

Operations of the safety estimation device 100 for batteries constructed thus will be described next.

Figure 3:
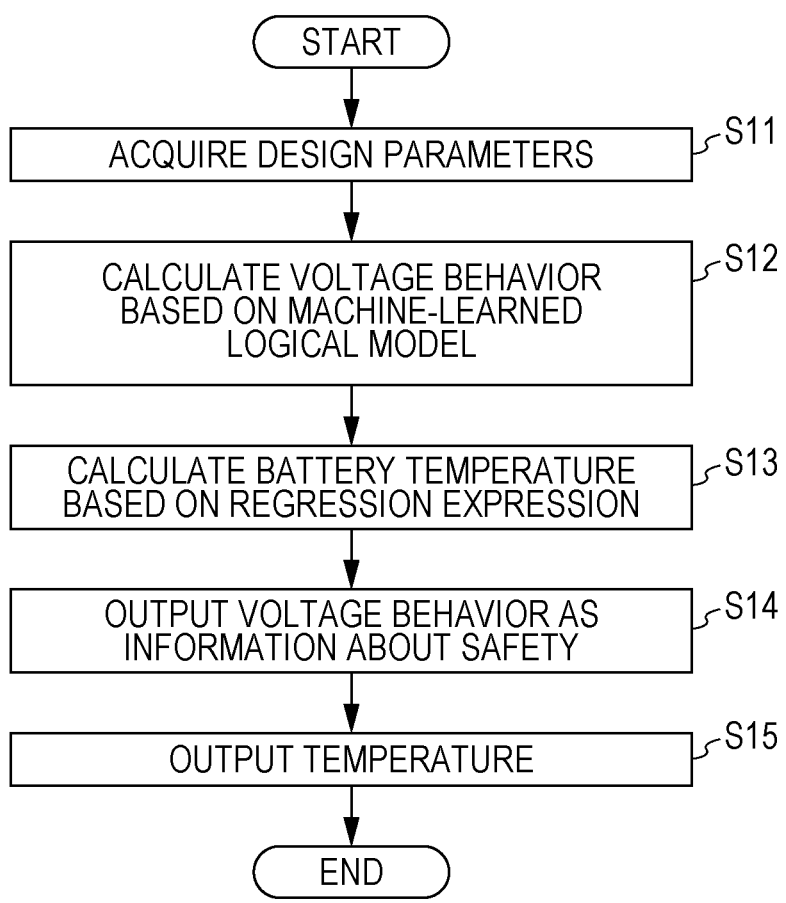
FIG. 3 is a flowchart illustrating a safety estimation method for batteries in the safety estimation device for batteries according to the embodiment.

First, the method by which the safety estimation device 100 for batteries estimates safety of the battery will be described. FIG. 3 is a flowchart illustrating a safety estimation method for batteries at the safety estimation device 100 for batteries.

The parameter acquirer 10 first acquires design parameters 11 of the battery (S11), as illustrated in FIG. 3. The parameter acquirer 10 transmits the acquired design parameters 11 to the calculator 20. The parameter acquirer 10 may acquire design parameters 11 of a single battery, or may acquire design parameters 11 for each of multiple batteries.

Next, the calculator 20 calculates voltage behavior of the battery from the design parameters 11 transmitted from the parameter acquirer 10, based on the machine-learned logical model 41 stored in the storage 40 (S12). The calculator 20 transmits the calculated voltage behavior of the battery to the outputter 30. The calculator 20 may also store the calculated voltage behavior of the battery in the storage 40. In a case where the parameter acquirer 10 has acquired multiple sets of design parameters 11 the calculator 20 calculates voltage behavior of the batteries from each of the multiple sets of design parameters 11.

The level of correlation between voltage behavior of the battery and temperature of the battery is high. Accordingly, safety regarding heat generation of the battery can be estimated by calculating the voltage behavior of the battery.

Next, the calculator 20 calculates the temperature of the battery from the calculated voltage behavior of the battery, based on the regression expression 42 of the voltage behavior of the battery and temperature of the battery (S13). The calculator 20 transmits the calculated temperature of the battery to the outputter 30. The calculator 20 may also store the calculated temperature of the battery in the storage 40.

Next, the outputter 30 outputs the voltage behavior of the battery that has been received from the calculator 20 as information about safety regarding heat generation of the battery (S14). The outputter 30 may output voltage behavior of the battery as it is, as information about safety regarding heat generation of the battery. Alternatively, the outputter 30 may output information about safety regarding heat generation of the battery, as information based on voltage behavior of the battery. Examples of information based on voltage behavior of the battery include determination results based on a safety determination standard, or the like.

Next, the outputter 30 outputs the temperature of the battery that has been received from the calculator 20 (S15). Note that step S14 step S15 may be performed in reverse order, or may be performed at the same time.

Also, in step S14, the outputter 30 may output the temperature of the battery, instead of voltage behavior of the battery, as information about safety regarding heat generation of the battery.

In this way, the safety estimation device 100 estimates voltage behavior of the battery, which has a high level of correlation with the temperature of the battery, from design parameters of the battery. Thus, safety regarding heat generation of the battery is estimated. Accordingly, the safety estimation device 100 can estimate safety regarding heat generation of the battery from design parameters of the battery, even with regard to a battery with unknown combination design.

Next, a method of constructing the machine-learned logical model 41 by the safety estimation device 100 for batteries will be described.

Figure 4:
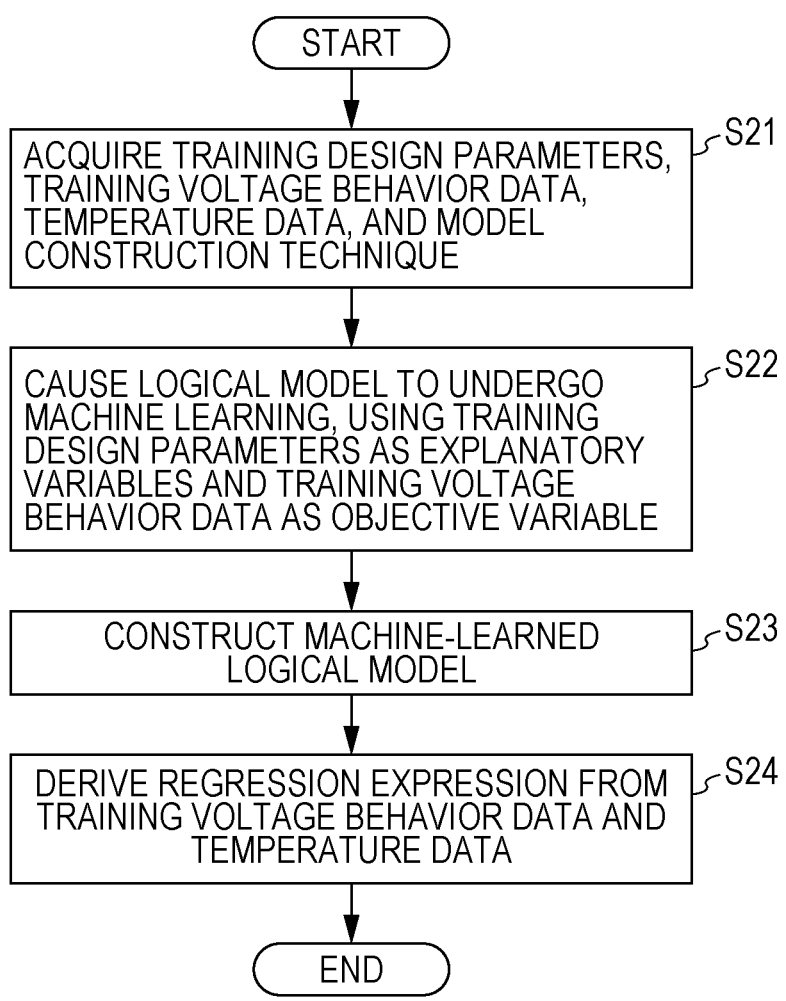
FIG. 4 is a flowchart illustrating a method for constructing a machine-learned logical model in the safety estimation device for batteries according to the embodiment.

FIG. 4 is a flowchart illustrating a method of constructing the machine-learned logical model 41 at the safety estimation device 100 for batteries.

The training data acquirer 50 first acquires the training design parameters 51 of the battery, the training voltage behavior data 52 indicating the voltage behavior of the battery, the temperature data 53 of the battery, and the model construction technique 54 to be used for machine learning (S21), as illustrated in FIG. 4. The battery is a training battery prepared for machine learning, for example. The training data acquirer 50 causes the storage 40 to store the training design parameters 51, training voltage behavior data 52, and temperature data 53. The training data acquirer 50 acquires combinations of training design parameters 51 and training voltage behavior data 52 regarding 100 or more training batteries, preferably 300 or more training batteries. The number of training batteries to be used for acquisition of the training design parameters 51 and training voltage behavior data 52 may be any number provided that the machine-learned logical model 41 to be constructed reaches the intended estimation precision or higher.

The training data acquirer 50 also transmits the acquired model construction technique 54 to the learner 60.

Next, the learner 60 uses the received model construction technique 54 to construct a logical model, such as a model expression for calculating training voltage behavior data 52 from training design parameters 51. The learner 60 uses the training design parameters 51 and training voltage behavior data 52 stored in the storage 40 as training data to cause the constructed logical model to undergo machine learning, using the training design parameters 51 as explanatory variables and the training voltage behavior data 52 as an objective variable (S22). The learner 60 thus constructs the machine-learned logical model 41 (S23). The learner 60 sets, for example, multiple types of parameters in the logical model and causes the logical model to undergo machine learning in a comprehensive manner regarding combinations of these parameters. The learner 60 causes the constructed machine-learned logical model 41 to be stored in the storage 40.

Voltage behavior of batteries is easy to measure, and temporal resolution regarding change thereof is high. Accordingly, training voltage behavior data 52 using voltage behavior of batteries is useful as training data for constructing a machine-learned logical model 41 that has high estimation precision.

In a case of confirming precision of estimating safety of a battery using the machine-learned logical model 41 constructed in step S23, training design parameters 51 and training voltage behavior data 52 of multiple batteries not used for machine learning are used, for example. In this case, a correlation coefficient $R^2$ between the voltage behavior estimated by the machine-learned logical model 41 and the training voltage behavior data 52 of the batteries is preferably 0.4 or higher, and more preferably 0.7 or higher, for example.

Next, the learner 60 derives the regression expression 42 from the training voltage behavior data 52 and temperature data 53 stored in the storage 40 (S24). The regression expression 42 is derived as a regression expression of linear approximation of the training voltage behavior data 52 and temperature data 53, for example. The learner 60 causes the constructed regression expression 42 to be stored in the storage 40.

Thus, the safety estimation device 100 constructs a machine-learned logical model where machine learning has been performed by using voltage behavior of batteries, which is easy to measure and has high temporal resolution regarding change, as an objective variable. Also, the voltage behavior of batteries has a high level of correlation with temperature of the batteries. Accordingly, in a case of estimating safety regarding heat generation of a battery from design parameters of the battery, the safety estimation device 100 can construct a machine-learned logical model that has high estimation precision.

EXAMPLES

Examples where batteries for evaluation are fabricated, and safety regarding heat generation of the batteries is estimated, will be described below. It should be noted that the examples given below are only exemplary, and that the present disclosure is not restricted to the following examples.

Structure of Battery

Figure 5:
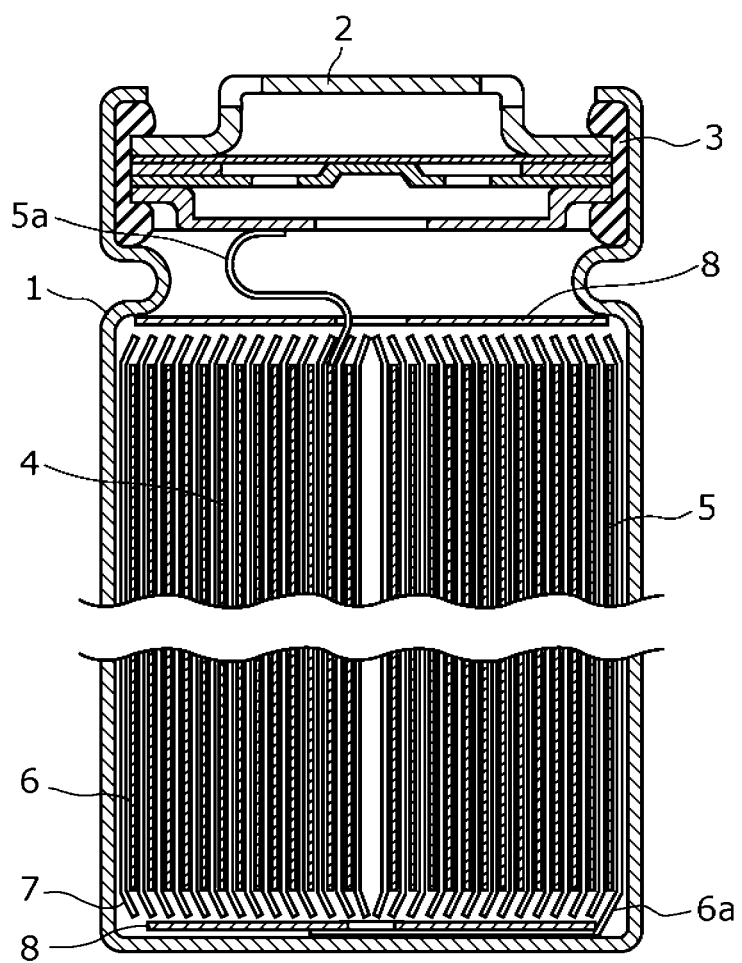
FIG. 5 is a sectional view illustrating a schematic configuration of a battery for evaluation used in safety estimation.

First, a battery for evaluation used for estimating safety will be described. FIG. 5 is a sectional view illustrating a schematic configuration of a battery for evaluation, used in safety estimation.

The battery for evaluation used in estimation of safety is provided with a battery case 1, an electrode group 4 accommodated within the battery case 1, and insulating rings 8 disposed above and below the electrode group 4, as illustrated in FIG. 5. The battery case 1 has an opening at the upper side, the opening being sealed off by a sealing plate 2.

The electrode group 4 has a configuration where a positive electrode 5 and a negative electrode 6 are spirally rolled up multiple times, with a separator 7 interposed therebetween. A positive electrode lead 5a comprising aluminum, for example, extends from the positive electrode 5. A negative electrode lead 6a comprising nickel, for example, extends from the negative electrode 6. The positive electrode lead 5a is connected to the sealing plate 2 of the battery case 1. The negative electrode lead 6a is connected to the bottom portion of the battery case 1. An electrolytic solution is poured into the battery case 1 along with the electrode group 4, although not illustrated in the drawing.

Method of Fabricating the Battery for Evaluation

Next, a method of fabricating the battery for evaluation will be described. The battery for evaluation is fabricated by the following fabrication method.

(1) Positive Electrode

Two parts by mass of acetylene black, two parts by mass of polyvinylidene difluoride, and an appropriate amount of N-methyl-2-pyrrolidone (NMP) were mixed into 100 parts by mass of $LiNi_{1/3}Co_{1/3}Mn_{1/3}O_2$ by using a mixer, thereby preparing a positive-electrode mixture slurry. This positive-electrode mixture slurry was coated onto both surfaces of a current collector sheet comprising aluminum foil 15 μm thick, dried, and rolled, thereby obtaining a positive electrode strip. The positive electrode strip was cut to a size corresponding to a cylindrical 18650 battery case, and an aluminum lead was welded thereto, thereby yielding a positive electrode to be used in the battery for evaluation. The thickness of the positive electrode was 128 μm.

(2) Negative Electrode

Graphite particles with 20 μm average grain size were used as a negative electrode active material, and one part by mass of carboxymethyl cellulose serving as a thickening agent, one part by mass of styrene-butadiene rubber serving as a binder, and an appropriate amount of purified water were mixed into 100 parts by mass of the negative electrode active material by using a mixer, thereby preparing a negative-electrode mixture slurry. This negative-electrode mixture slurry was coated onto both surfaces of a current collector sheet comprising electrolytic copper foil 8 μm thick, dried, and rolled, thereby obtaining a negative electrode strip.

The amount of coating of the negative-electrode mixture slurry was determined so that the negative electrode charging capacity and the positive electrode charging capacity satisfy the relational expression (negative electrode charging capacity)/(positive electrode charging capacity)=1.1 where 4.2 V is stipulated as a full-charged state.

The negative electrode strip was cut to a size corresponding to the cylindrical 18650 battery case, and a nickel lead was welded thereto, thereby yielding a negative electrode to be used in the battery for evaluation.

(3) Non-Aqueous Electrolyte

Ethylene carbonate (EC), ethyl methyl carbonate (EMC), and dimethyl carbonate (DMC) were mixed so that the volume ratio of EC:EMC:DMC was 1:1:8. $LiPF_6$ was dissolved in the mixed material at a concentration of 1.2 mol/L, thereby yielding a non-aqueous electrolyte to be used in the battery for evaluation.

(4) Electrode Group

The positive electrode and negative electrode thus obtained were rolled up with a separator comprising a microporous film of polyethylene, 16 μm thick, interposed therebetween, thereby configuring the electrode group in a spiral shape. The obtained electrode group was accommodated in the cylindrical 18650 battery case, and negative electrode and positive electrode leads and so forth were connected. The above non-aqueous electrolyte was then added into the battery case so as to contain 1.59 to 1.72 g per Ah in design capacity, the electrode group was impregnated with the non-aqueous electrolyte under vacuum, and thereafter the battery case was sealed off by the sealing plate. The sealing plate used for sealing off has a safety valve that operates when pressure within the battery reaches an upper limit value, and functions to discharge gas that has been generated within the battery.

The cylindrical battery illustrated in FIG. 5 was completed through the processes described above, thereby yielding the battery for evaluation.

Method of Confirming Initial Battery Capacity

The obtained battery for evaluation was charged to 4.1 V at an electric current value equivalent to 0.2 C under a 25° C. environment, and then aged for three days in a 45° C. thermostatic bath. Additionally, the charged battery for evaluation was discharged to 3 V at an electric current value equivalent to 0.2 C under a 25° C. environment.

Further, the discharged battery for evaluation was subjected to constant-voltage charging under conditions of maximum current value 0.2 C, charging voltage value 4.2 V, and end-of-charge current 0.05 C, and discharged under conditions of discharge current 0.2 C and end-of-discharge voltage 3.0 V, and the initial battery capacity was confirmed.

Method of Acquiring Design Parameters

In order to acquire explanatory variables to be used for machine learning, batteries for evaluation were fabricated by a method similar to that in the above section "Method of Fabricating the Battery for Evaluation", with values being varied as design parameters:
(I) composition of positive-electrode active material,
(II) composition of negative electrode active material,
(III) positive electrode plate and negative electrode plate
  (i) thickness,
  (ii) length,
  (iii) width,
  (iv) density,
  (v) usage capacitance of active material, and
  (vi) composition of mixture,
(IV) separator
  (i) thickness,
  (ii) length,
  (iii) width,
  (iv) porosity, and
(V) electrolytic solution
  (i) composition and
  (ii) amount The initial battery capacity of the fabricated batteries for evaluation was confirmed as a design parameter by using the same method as that in the section "Method of Confirming Initial Battery Capacity". Further, batteries for evaluation having the same configuration were also evaluated with charging depths and testing temperatures at the time of testing being varied as testing conditions. 480 batteries for evaluation were fabricated, and data sets of battery design parameters including testing conditions, were obtained for the 480 batteries for evaluation.

Method of Acquiring Voltage Behavior, Temperature, and Pressure

The fabricated batteries for evaluation were subjected to constant-voltage charging under conditions of maximum current value 0.2 C, charging voltage value 4.2 V, and end-of-charge current 0.05 C. Next, nickel leads for voltage measurement were welded to each of the terminals for the positive electrode and negative electrode. A thermocouple was fixed by heat-resistant tape around the middle in the height direction of each battery for evaluation with leads welded thereto, and each battery for evaluation to which the thermocouple was fixed was placed in a testing chamber of a nail penetration tester. A nail penetration tester capable of nail penetration testing in a sealed testing chamber, in which a pressure sensor for measuring internal pressure was installed, was used as the nail penetration tester.

Figure 6:
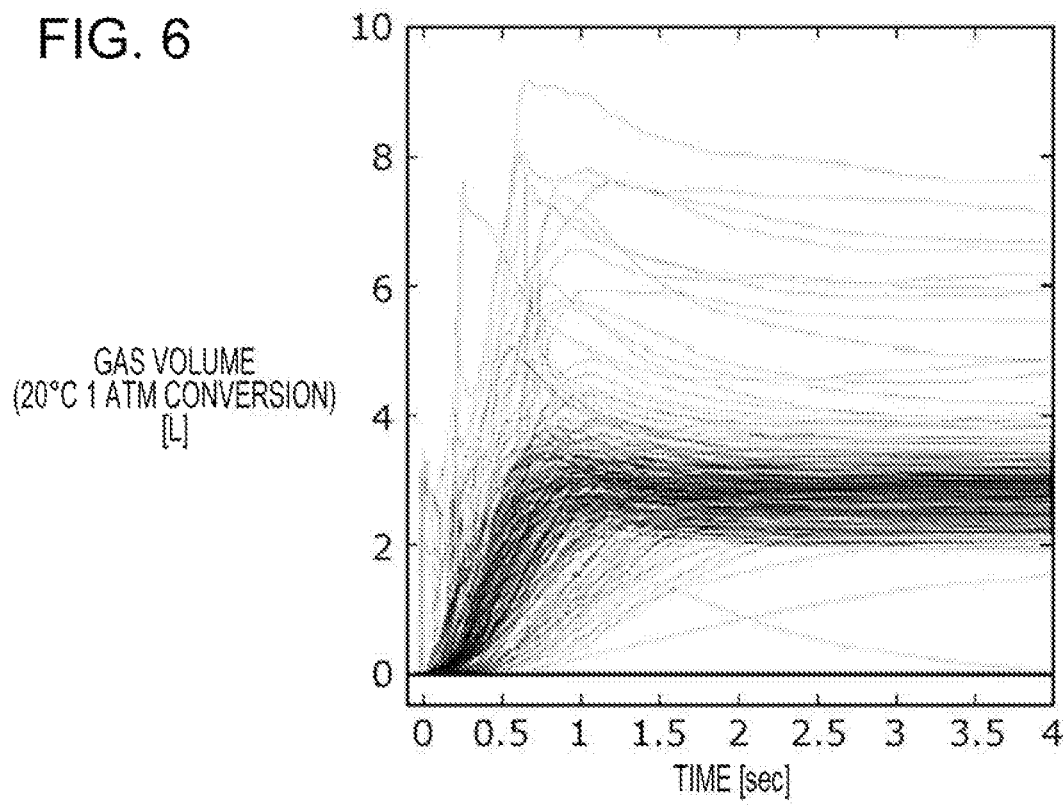
FIG. 6 is a diagram illustrating a relationship between amount of gas generated and elapse of time in batteries for evaluation.
Figure 7:
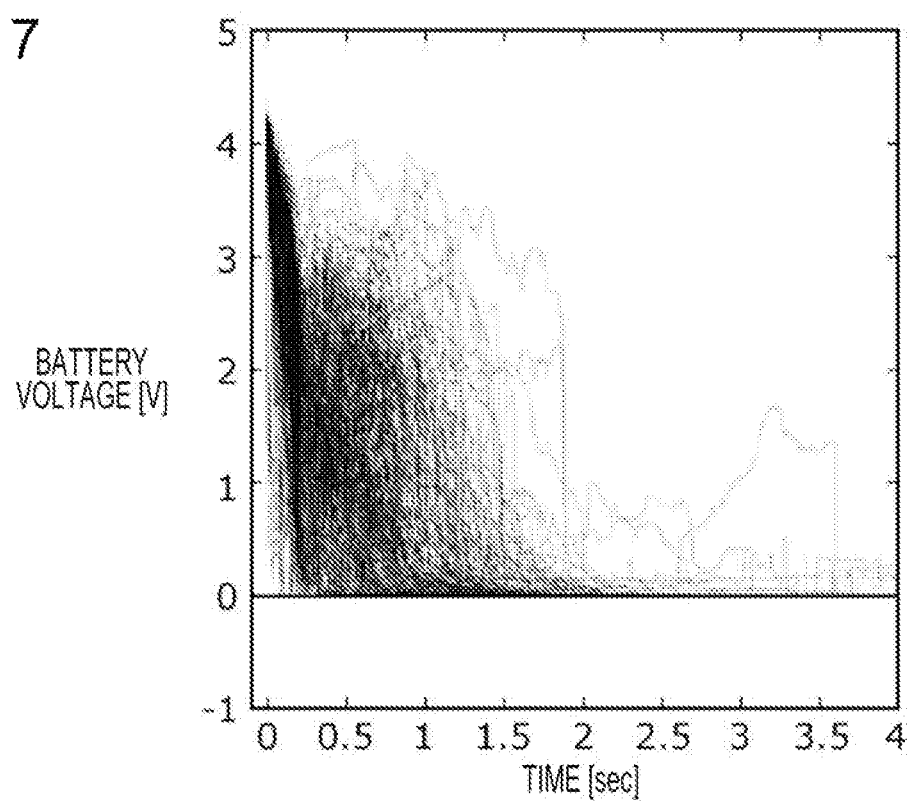
FIG. 7 is a diagram illustrating a relationship between voltage and elapse of time in batteries for evaluation.

The testing chamber was controlled so that the temperature of the battery was 65° C. inside the testing chamber, an iron wire nail having a shank diameter of 3 mm was used, and the battery for evaluation was penetrated by the nail at a speed of 80 mm/second, thereby causing internal short-circuiting. The voltage of the battery for evaluation, the temperature of the battery for evaluation, and the pressure within the testing chamber, after the internal short-circuiting, were measured. Further, the pressure within the testing chamber changes depending on temperature as well, and accordingly the measured pressure within the testing chamber was converted into gas volume at 1 atm and 20° C. by using a state equation, to normalize the values for the batteries for evaluation and the testing conditions, and calculation was performed for the gas volume generated after the occurrence of short-circuiting. FIG. 6 is a diagram illustrating the amount of gas generated after short-circuiting occurring in the batteries for evaluation. FIG. 7 is a diagram illustrating the voltage behavior after short-circuiting occurring in the batteries for evaluation. In FIGS. 6 and 7, time 0 is the time at which the nail penetrated the batteries for evaluation and internal short-circuiting occurred. Data for the 480 batteries for evaluation fabricated according to the section "Method of Fabricating the Battery for Evaluation" above is plotted in FIGS. 6 and 7.

Method of Constructing Model Expression and Calculating Estimation Precision

A model expression was constructed by machine learning, using the data obtained according to the sections "Method of Acquiring Design Parameters" and "Method of Acquiring Voltage Behavior, Temperature, and Pressure".

The three model construction techniques of gradient boosting, support-vector regression, and random forest regression were used for machine learning. Machine learning was performed by using each of these techniques, thereby constructing a model expression for each of the three techniques, as a logical model capable of estimating and calculating objective variables such as voltage behavior of the battery, temperature of the battery, pressure change of the battery, and so forth, from design parameters including test conditions as explanatory variables. For example, in gradient boosting, multiple parameters such as a learning rate, max features, and so forth were set, and machine learning was performed comprehensively regarding combinations of these parameters. Each of these model construction techniques for machine learning is a technique including nonlinear action from design parameters including testing conditions as explanatory variables to objective variables. Learning was efficiently performed for the data sets of the 480 batteries for evaluation as well.

Specifically, the data sets of the 480 batteries for evaluation that were obtained were divided into six random groups. Design parameters including testing conditions of data sets of batteries for evaluation belonging to five random groups out of these six groups, i.e., data sets of 400 batteries for evaluation, were used as training data for machine learning, as explanatory variables. The above-described machine learning method was performed to derive a model expression that has been machine-learned, which estimates objective variables such as voltage behavior of batteries, temperature of batteries, pressure change of batteries, and so forth, as a machine-learned logical model. In other words, 400 batteries for evaluation were used as training batteries. Subsequently, the data sets belonging to the group of the batteries for evaluation not used as training data, i.e., the data sets of 80 batteries for evaluation, were used as data for verification. Design parameters including evaluation conditions were substituted into the earlier-derived model expression that has been machine-learned, and objective variables were estimated. The correlation coefficient $R^2$ at the time of linear regression of the estimated objected variables and measured objected variables was calculated as estimation precision. Note that in the calculation results for estimation precision below, shown is the value of estimation precision in the case of using the model construction technique yielding the highest estimation precision out of the three model construction techniques.

Comparative Example 1

Temperature of batteries was used as the objective variable to estimate safety of the batteries in Comparative Example 1.

A model expression that has been machine-learned, in which battery temperature ten seconds after occurrence of short-circuiting is the objective variable, was derived and estimation precision was calculated by the method described in the section "Method of Constructing Model Expression and Calculating Estimation Precision". The correlation coefficient $R^2$ of the estimated objected variables and measured objected variables was 0.143. Thus, results indicating low estimation precision were obtained.

The time at which the volume of generated gas and voltage markedly change is within one second after short-circuiting occurring, as illustrated in FIGS. 6 and 7. In contrast with this, the range of change of temperature was small immediately after short-circuiting occurring, and it was ten seconds or later when trends in difference were manifested among the batteries for evaluation. It can be deduced therefrom that change in temperature has insufficient temporal resolution, and is not suitable as an objective variable for estimating behavior after occurrence of short-circuiting.

Example 1

Voltage behavior of batteries was used as the objective variable to estimate safety of the batteries in Example 1.

(1) Correlation Between Temperature and Pressure

First, correlation between temperature of batteries and pressure change of batteries was studied, to ascertain whether measured data other than the temperature of batteries could be used as alternative data to temperature of batteries. The gas volume, i.e., the pressure within the testing chamber starts changing immediately after short-circuiting occurs, as illustrated in FIG. 6, and accordingly temporal resolution is high. The gas volume of almost all batteries for evaluation changes in the time span from occurrence of short-circuiting to one second later. Also, the gas generation rate was calculated as data indicating change in pressure, using the amount of change in gas from gas generation starting to one second after short-circuiting occurring, since the volume of gas generated increases at a generally constant rate until reaching the maximum value. Calculating the correlation coefficient between the gas generation rate and the temperature ten seconds after short-circuiting occurring by using measurement results of the 480 batteries for evaluation yielded a correlation coefficient $R^2$ of 0.76. Thus, results were obtained that correlation is high between the gas generation rate and temperature. That is to say, the slower the gas generation rate of a given battery for evaluation is, the lower the temperature of the battery is, and thus is safer. Accordingly, the gas generation rate of batteries may be estimated so as to estimate safety regarding heat generation of batteries.

(2) Correlation Between Voltage and Pressure

Figure 8:
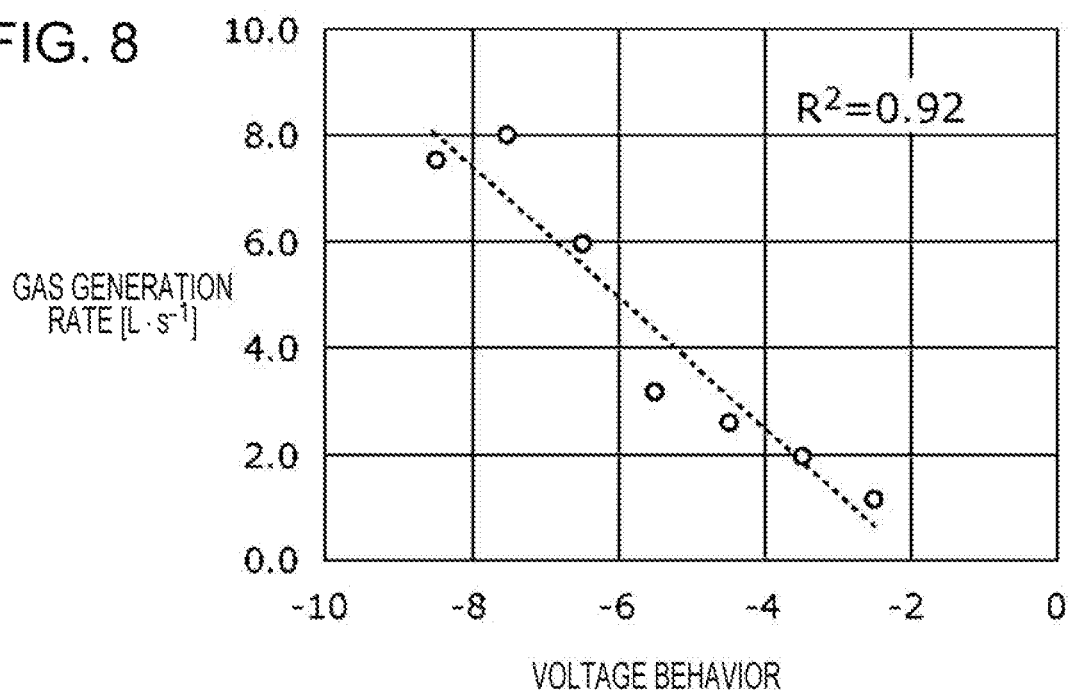
FIG. 8 is a diagram illustrating a relationship between voltage behavior and gas generation rates in batteries for evaluation.

Next, correlation between temporal change of pressure at the time of occurrence of short-circuiting of batteries and voltage behavior of the batteries will be described. Voltage of the batteries for evaluation markedly change immediately after short-circuiting, as illustrated in FIG. 7, and accordingly temporal resolution is high. The voltage of almost all batteries for evaluation changes in the time span from occurrence of short-circuiting to one second later, in the same way as with the gas generation rate. Accordingly, voltage behavior was calculated by using results of voltage from occurrence of short-circuiting to one second later. FIG. 8 is a diagram illustrating the relationship between voltage behavior from occurrence of short-circuiting to one second later, and gas generation rates from occurrence of short-circuiting to one second later, in batteries for evaluation. The calculated voltage behavior to one second after and the gas generation rates to one second after exhibited a high level of correlation, as illustrated in FIG. 8. Calculating the correlation coefficient for linear regression of the voltage behavior to one second after and the gas generation rates to one second after by using measurement results of the 480 batteries for evaluation yielded a correlation coefficient $R^2$ of 0.92.

Also, calculating the correlation coefficient at the time of linear regression of the voltage behavior and temperature ten seconds after short-circuiting occurring yielded a correlation coefficient $R^2$ of 0.84.

(3) Calculation of Estimation Precision

Figure 9:
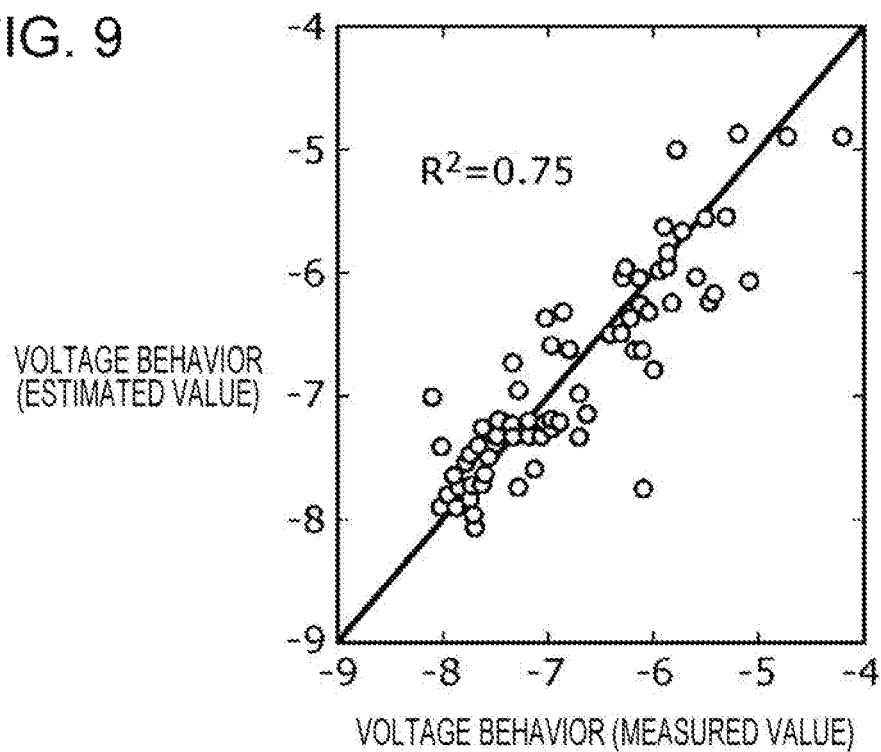
FIG. 9 is a diagram illustrating a relationship between estimated voltage behavior and measured voltage behavior in batteries for evaluation.

Results of estimating safety of batteries by using voltage behavior of the batteries as an objective variable will be described next. A model expression that has been machine-learned, in which voltage behavior of the batteries is the objective variable, was derived and estimation precision was calculated by the method described in the section "Method of Constructing Model Expression and Calculating Estimation Precision". FIG. 9 is a diagram illustrating a relationship between voltage behavior in the batteries for evaluation estimated by substituting design parameters of data for verification in the model expression that has been machine-learned, and measured voltage behavior.

The correlation coefficient $R^2$ between the estimated voltage behavior and the measured voltage behavior was 0.75, as illustrated in FIG. 9. Thus, results were obtained indicating a high level of estimation precision. That is to say, safety regarding heat generation of batteries can be predicted with a high level of precision from design parameters of batteries by using the model expression derived by machine learning with voltage behavior of batteries as the objective variable.

Example 2

In Example 2, safety of batteries was estimated by using model construction techniques illustrated in the following Table, with voltage behavior of the batteries as the objective variable.

The same method as in the section "Method of Constructing Model Expression and Calculating Estimation Precision" was used, other than using the model construction techniques in the following Table, and a model expression that has been machine-learned, in which voltage behavior of the batteries is the objective variable, was derived and estimation precision was calculated. Table shows the results of estimation precision calculated. Table 1 lists the model construction techniques used and the results of estimation precision, in descending order of estimation precision.

TABLE 1

| Model No. | Model Name (Model Construction Technique) | Estimation Precision ($R^2$) |
|---|---|---|
| 32 | Gradient Boosted Trees Regressor (gradient boosting) | 0.75 |
| 31 | Support Vector Regressor | 0.72 |
| 36 | Auto-tuned K-Nearest Neighbors Regressor | 0.71 |
| 20 | Nystroem Kernel SVM Regressor | 0.71 |
| 16 | Ridge Regressor | 0.70 |
| 38 | Neural Network Regressor | 0.53 |
| 53 | Lasso Regressor | 0.43 |

It can be seen from Table 1 that the estimation precision was higher than the estimation precision using the temperature at the time of short-circuiting occurring as the objective variable in Comparative Example 1, regardless of which model construction technique was used. It can also be seen that estimation precision when using gradient boosting as the model construction technique is higher than when using other model construction techniques.

Other Embodiments

Although the safety estimation device for batteries and safety estimation method for batteries according to the present disclosure have been described by way of an embodiment, the present disclosure is not restricted to this embodiment. Arrangements where various types of modifications conceivable by one skilled in the art have been made on the embodiment, and other embodiments constructed by combining some of components of the embodiments, without departing from the essence of the present disclosure, are also encompassed by the scope of the present disclosure.

For example, the safety estimation device 100 is provided with the training data acquirer 50 and learner 60 in the above-described embodiment, and the learner 60 constructs the machine-learned logical model 41, but this is not restrictive. An arrangement may be made where the safety estimation device 100 does not have the training data acquirer 50 and learner 60, and acquires and stores in the storage 40 a machine-learned logical model 41 constructed beforehand.

Also, although the safety estimation device 100 calculates and outputs, for example, temperature of batteries in the above-described embodiment, this is not restrictive. The safety estimation device 100 may be a device that only outputs voltage behavior of batteries as safety information about batteries.

Also, although the safety estimation device 100 is provided with the storage 40 for example, this is not restrictive. The safety estimation device 100 may use an external server or the like instead of the storage 40 by communicating with the external server or the like via a communication unit, such as a wired or wireless communication interface or the like.

Also, for example, the safety estimation device 100 may be provided with a verifier that verifies estimation precision of a machine-learned logical model 41 by using part of each of acquired training design parameters 51 and training voltage behavior data 52. The verifier may verify estimation precision of the constructed machine-learned logical model 41 following step S23 in FIG. 4. In this case, the safety estimation device 100 may repetitively perform steps S21 through S23 while changing at least one of the training design parameters 51, training voltage behavior data 52, and model construction technique 54, until a machine-learned logical model 41 that has a certain level of estimation precision is constructed. The verifier comprises, for example, a CPU, RAM, ROM, and so forth.

Also, for example, an arrangement may be made where multiple machine-learned logical models 41 are stored in the storage 40, and the calculator 20 uses the multiple machine-learned logical models 41 to calculate voltage behavior of batteries corresponding to each of the machine-learned logical models 41. In this case, the outputter 30 may output voltage behavior of the batteries calculated from one of the machine-learned logical models as information about safety regarding heat generation of batteries, or from a perspective of raising estimation precision, may output an average of voltage behavior of the batteries calculated from each of the machine-learned logical models 41 as information about safety regarding heat generation of batteries.

Also, a method including steps (processes) performed by the components making up the safety estimation device for batteries and safety estimation method for batteries according to the above-described embodiment may be executed by a computer (computer system), for example. The present disclosure may be realized as a program for causing the computer to execute the steps included in the method. The present disclosure may further be realized as a non-transitory computer-readable recording medium, such as a CD-ROM or the like, storing the program.

In a case where the above-described embodiment is to be realized by a program (software), the steps are executed by the program being executed by using hardware resources such as the CPU, memory, an input/output circuit, and so forth, of the computer, for example. That is to say, the steps are executed by the CPU acquiring data from the memory or input/output circuit or the like and performing computation, and outputting computation results to the memory or input/output circuit or the like, and so forth.

According to the safety estimation device for batteries and so forth of the present disclosure, safety regarding heat generation can be estimated even for batteries of unknown design, and can be suitably used for a battery control technique and for realization of batteries with a high level of safety.

What is claimed is:

1. A safety estimation device for batteries, comprising:
a parameter acquirer that acquires a design parameter of a battery;
a predictor that predicts voltage behavior of the battery after a short-circuit occurs in the battery from the design parameter, based on a machine-learned logical model, and estimates a safety of the battery based on the predicted voltage behavior and a safety determination standard; and
an outputter that outputs the voltage behavior as information regarding heat generation of the battery and the estimated safety,
wherein the machine-learned logical model is generated by performing machine learning using one or more battery design parameters as an explanatory variable and a battery voltage behavior as an objective variable.

2. The safety estimation device for batteries according to claim 1, further comprising:
a training data acquirer that acquires a training design parameter of a training battery as the one or more battery design parameters, and a training voltage behavior data indicating a voltage behavior of the training battery; and
a learner that constructs the machine-learned logical model by causing a logical model to undergo machine learning, using the training design parameter as an explanatory variable and the training voltage behavior data as an objective variable.

3. The safety estimation device for batteries according to claim 2, wherein
the learner uses gradient boosting as a method to construct the machine-learned logical model in the machine learning.

4. The safety estimation device for batteries according to claim 1, wherein
the predictor further predicts temperature of the battery from the voltage behavior of the battery wherein the voltage behavior of the battery is predicted by the predictor, based on correlation between voltage behavior of a training battery and temperature of the training battery, and
the outputter further outputs the temperature.

5. The safety estimation device for batteries according to claim 1, wherein the design parameter includes at least one of (i) dimensions of an electrode, (ii) a density of the electrode, (iii) dimensions of a separator, or (iv) an amount of electrolytic solution, making up part of the battery.

6. The safety estimation device for batteries according to claim 5, wherein
the design parameter further includes at least one of (v) composition of material of the electrode or the electrolytic solution, (vi) physical property of material of the electrode or the electrolytic solution, or (vii) capacity of the battery, making up part of the battery.

7. The safety estimation device for batteries according to claim 1, wherein the design parameter includes (i) dimensions of an electrode.

8. The safety estimation device for batteries according to claim 1, wherein the design parameter includes (ii) a density of the electrode.

9. The safety estimation device for batteries according to claim 1, wherein the design parameter includes (iii) dimensions of a separator.

10. The safety estimation device for batteries according to claim 1, wherein the design parameter includes (iv) an amount of electrolytic solution, making up part of the battery.

11. The safety estimation device for batteries according to claim 1, wherein the design parameter includes all of (i) dimensions of an electrode, (ii) density of the electrode, (iii) dimensions of a separator, and (iv) an amount of electrolytic solution.

12. A safety estimation method for batteries, comprising:
acquiring a design parameter of a battery;
predicting voltage behavior of the battery after a short-circuit occurs in the battery from the design parameter, based on a machine-learned logical model;
estimating a safety of the battery based on the predicted voltage behavior and a safety determination standard; and
outputting the voltage behavior as information about heat generation of the battery and the estimated safety, the machine-learned logical model is generated by performing machine learning using one or more battery design parameters as an explanatory variable and a battery voltage behavior as an objective variable.

13. The safety estimation method for batteries according to claim 12, wherein the machine learning is performed by:

acquiring a training design parameter of a training battery as the one or more battery design parameters, and training a voltage behavior data indicating a voltage behavior of the training battery; and constructing the machine-learned logical model by causing a logical model to undergo machine learning, using the training design parameter as an explanatory variable and the training voltage behavior data as an objective variable.

14. The safety estimation method according to claim 12, wherein the design parameter includes at least one of (i) dimensions of an electrode, (ii) a density of the electrode, (iii) dimensions of a separator, or (iv) an amount of electrolytic solution, making up part of the battery.

15. The safety estimation method according to claim 12, wherein the design parameter includes (i) dimensions of an electrode.

16. The safety estimation method according to claim 12, wherein the design parameter includes (ii) a density of the electrode.

17. The safety estimation method according to claim 12, wherein the design parameter includes (iii) dimensions of a separator.

18. The safety estimation method according to claim 12, wherein the design parameter includes (iv) an amount of electrolytic solution, making up part of the battery.

19. The safety estimation method according to claim 12, wherein the design parameter includes all of (i) dimensions of an electrode, (ii) density of the electrode, (iii) dimensions of a separator, and (iv) an amount of electrolytic solution.

* * * * *